(12) United States Patent
Chen

(10) Patent No.: US 7,764,569 B2
(45) Date of Patent: Jul. 27, 2010

(54) WORDLINE DRIVER FOR DRAM AND DRIVING METHOD THEREOF

(75) Inventor: Chih Jen Chen, Gueishan Township (TW)

(73) Assignee: Nanya Technology Corp., Nueishan (TW)

( * ) Notice: Subject to any disclaimer, the term of this patent is extended or adjusted under 35 U.S.C. 154(b) by 162 days.

(21) Appl. No.: 12/170,877

(22) Filed: Jul. 10, 2008

(65) Prior Publication Data

US 2009/0245011 A1 Oct. 1, 2009

(30) Foreign Application Priority Data

Apr. 1, 2008 (TW) .............................. 97111821 A

(51) Int. Cl.
*G11C 8/00* (2006.01)
(52) U.S. Cl. .............................. 365/230.06; 365/189.09
(58) Field of Classification Search ............ 365/230.06, 365/63, 189.09
See application file for complete search history.

(56) References Cited

U.S. PATENT DOCUMENTS

| | | | |
|---|---|---|---|
| 6,407,942 B2* | 6/2002 | Aritomi et al. | 365/63 |
| 6,628,564 B1* | 9/2003 | Takita et al. | 365/230.06 |
| 7,203,124 B2* | 4/2007 | Kim et al. | 365/230.06 |
| 7,345,946 B1* | 3/2008 | Chapman et al. | 365/230.06 |

* cited by examiner

*Primary Examiner*—Son Dinh
(74) *Attorney, Agent, or Firm*—Connolly Bove Lodge & Hutz LLP; Arlene P. Neal

(57) ABSTRACT

A wordline driver for DRAM comprises a multiplexer, an inverter and a transistor switch. One end of the multiplexer is connected to a wordline charging voltage, and the other end is connected to an external voltage, wherein the external voltage is less than the wordline charging voltage, and initially the external voltage is outputted. The output end of the inverter is connected to the select line of the multiplexer, and the input end thereof is electrically connected to the output end of the multiplexer. One end of the transistor switch is connected to the input end of the inverter, and the other end thereof is connected to the word line.

8 Claims, 2 Drawing Sheets

WORDLINE DRIVER FOR DRAM AND DRIVING METHOD THEREOF

BACKGROUND OF THE INVENTION

1. Field of the Invention

The present invention relates to a wordline driver applied in a DRAM, and more particularly to a power-saving wordline driver.

2. Description of the Related Art

DRAM is a commonly-seen memory, which is widely used in computers and other electronic appliances. Generally, DRAM includes a memory cell array composed of capacitors to store data. Because the capacitors lose charges after a period of time, it is necessary to refresh data in a fixed interval.

During the process of writing data to DRAM, to write a logic one voltage to the memory unit, it is necessary to provide a wordline precharge voltage VPP that is greater than an external voltage to the wordline. To generate voltage VPP, it is unavoidable to employ a VPP charge pump. However, the driving efficiency ($I_{vpp}/I_{vext}$) of the VPP charge pump is so low that the power consumption of the wordline driver is hardly to reduce.

FIG. 1 shows a commonly-used wordline driver 10. When the wordline is charged from VNWL to voltage VPP, the signals WLRST, bMWL, wldint must be logic zero. Meanwhile the voltage VPP charges the wordline through transistors 11 and 12, therefore the necessary current charging the wordline is provided by the voltage VPP. As mentioned above, because the necessary current is provided by the voltage VPP, the power consumption is large.

FIG. 2 shows a corresponding timing diagram of the wordline driver 10, wherein after the control signal wldint turns to zero, the output voltage WLDV of the transistor 11 is close to voltage VPP. In addition, after bMWL turns to logic zero, the voltage of the wordline (the output of the transistor 12) is close to voltage VPP. Because the control signal WLRST is logic zero, the transistor 13 remains off and the voltage of the wordline will not decrease.

To improve the power consumption of the wordline driver, some known methods tend to increase the driving efficiency of the VPP charge pump as much as possible. Therefore it is an important issue to control the power consumption of the wordline driver without adding many hardware resources.

SUMMARY OF THE INVENTION

The wordline driver applied in a DRAM in accordance with one embodiment of the present invention comprises a first transistor and a second transistor. The first transistor comprises a first terminal for receiving a first voltage and a second terminal for outputting the first voltage, wherein the first transistor selectively provides the first voltage to a wordline. The second transistor comprises a third terminal for receiving a second voltage and a fourth terminal for outputting the second voltage. The fourth terminal is electrically connected to the second terminal of the first transistor, the second transistor provides the second voltage to the wordline, and the second voltage is used to enable the wordline.

The wordline driver applied in a DRAM in accordance with one embodiment of the present invention comprises a multiplexer. The multiplexer comprises a first terminal, a second terminal and third terminal. The first terminal is used to receive a first voltage. The second terminal is used to receive a second voltage. The third terminal is used to selectively output the first voltage or the second voltage to a wordline, where the second voltage is used to enable the wordline.

The wordline driving method applied in a DRAM in accordance with one embodiment of the present invention comprises the steps of providing a first voltage on a wordline; and providing a second voltage on the wordline for enabling the wordline, where the first voltage is smaller than the second voltage.

BRIEF DESCRIPTION OF THE DRAWINGS

The invention will be described according to the appended drawings in which.

PREFERRED EMBODIMENT OF THE PRESENT INVENTION

Figure 1:
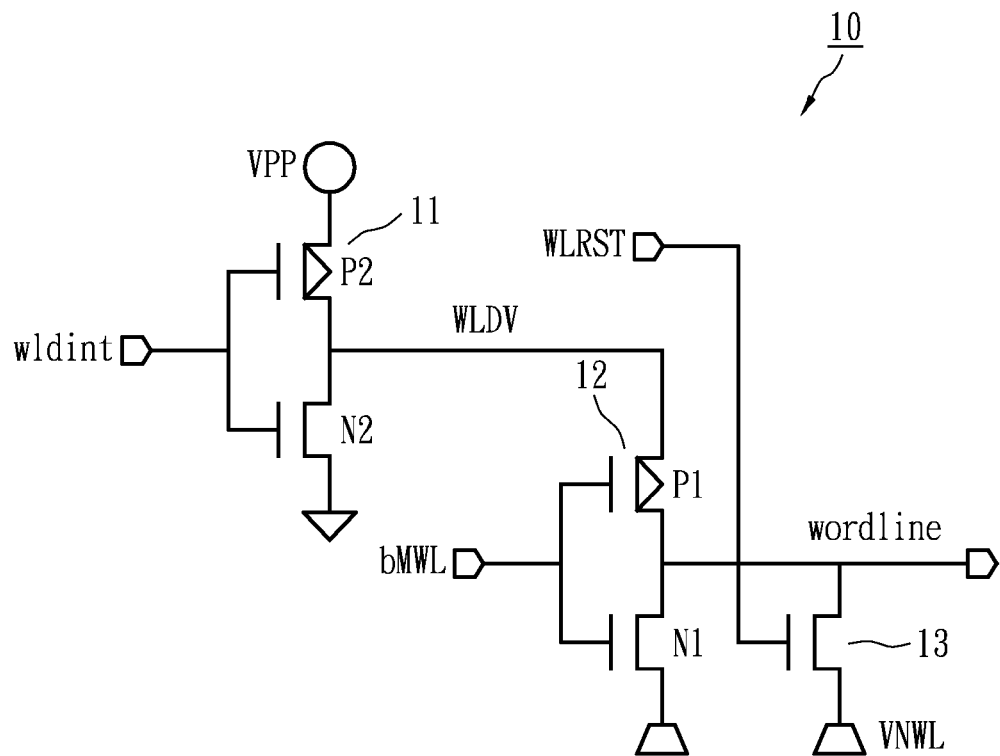
FIG. 1 shows a commonly-used wordline driver.
Figure 2:
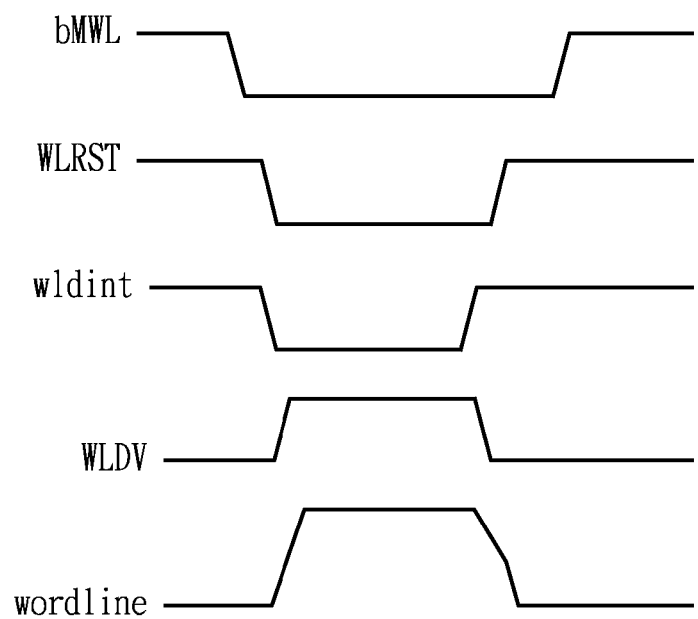
FIG. 2 shows a corresponding timing diagram of the wordline driver.
Figure 3:
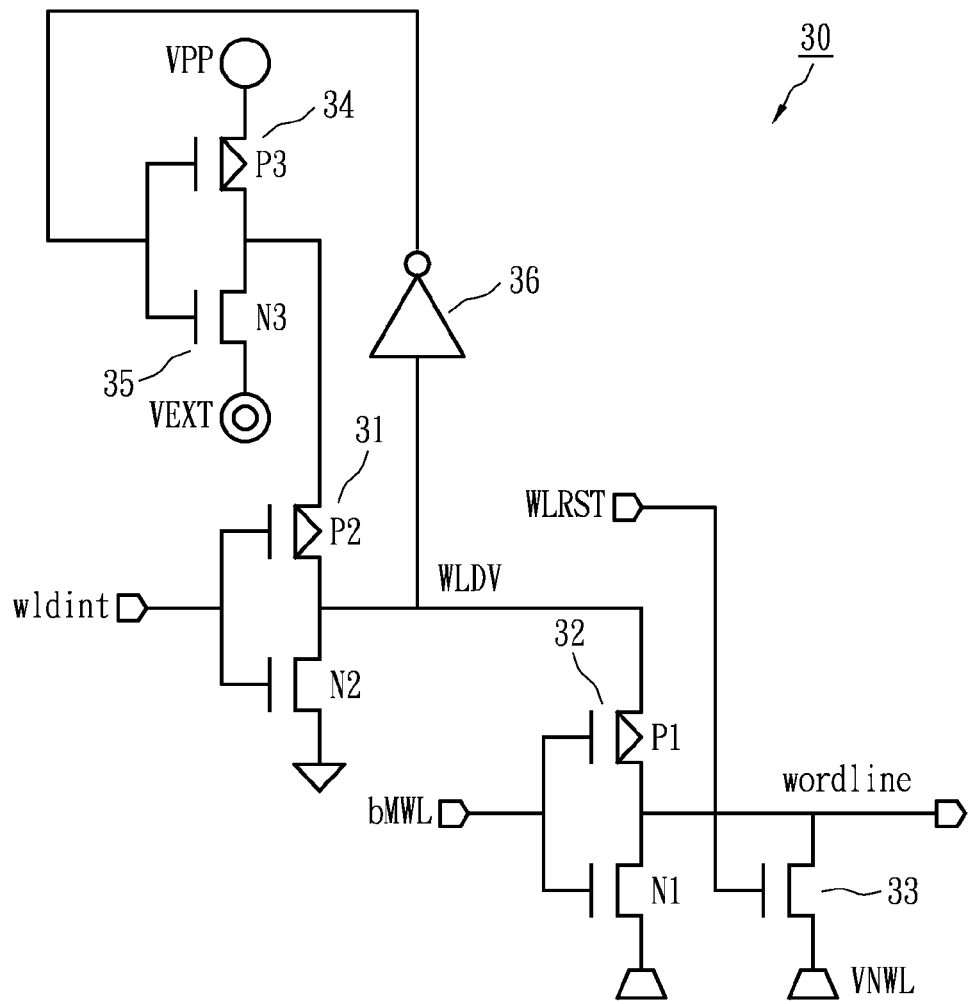
FIG. 3 shows a wordline driver applied in a DRAM according to one embodiment of the present invention.

FIG. 3 shows a wordline driver 30 applied in a DRAM according to one embodiment of the present invention. When the wordline is being charged from voltage level VNWL to VPP, meanwhile the control signals WLRST, bMWL, wldint are logic zero, and a voltage VEXT such as the power source of the DRAM starts to charge the wordline through transistors 35, 31 and 32, where the voltage VEXT is smaller than the voltage VPP. Because the transistor 31 is enabled, voltage WLDV gradually increases. When the voltage WLDV is high enough to convert the output of the inverter 36 into logic zero, the voltage VPP takes over and continues to charge the wordline through transistors 34, 31 and 32. The transistors 34 and 35 function as a multiplexer, and they are controlled by the inverter 36. One part of the current charging the wordline comes from the voltage VEXT, and the other part comes from the voltage VPP. By selecting different voltage sources other than the voltage VPP during the charging process, the purpose of conserving power is obtained.

Figure 4:
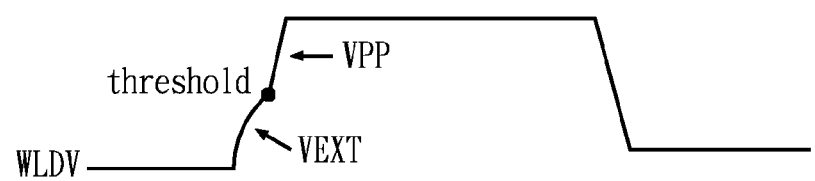
FIG. 4 shows a corresponding timing diagram of the wordline driver shown in FIG. 3.
Figure 4:
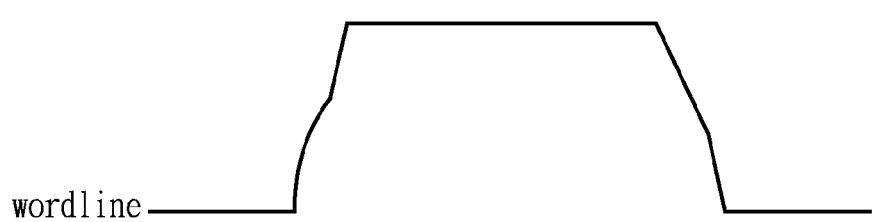

FIG. 4 shows a corresponding timing diagram of the wordline driver 30 shown in FIG. 3, where the voltage WLDV is grounded until the control signal wldint turns to logic zero. Through the inverter 36, the transistor 35 is turned on, and the transistor 35 outputs voltage VEXT. After the control signal wldint turns to logic zero, the output voltage WLDV of the transistor 31 is close to voltage VEXT. After the voltage bMWL turns to logic zero, the voltage of the wordline (the output of the transistor 32) is close to voltage VEXT. Because the control signal WLRST is logic zero, the transistor 33 will not be turned on and the voltage of the wordline remains unchanged. When the voltage WLDV reaches a threshold, meanwhile the output of the inverter 36 is logic zero, the transistor 34 is turned on, the transistor 35 is turned off, and the voltage VPP takes over to charge the wordline through the transistors 34, 31 and 32. The waveform in FIG. 4 clearly shows two phases of the charging process. Because the voltage VEXT is smaller than the voltage VPP, the first phase is dominated by the voltage VEXT, which exhibits a slower charging speed but reduces power consumption, and the second phase is dominated by the voltage VPP, which exhibits a faster charging speed but consumes more power. However, as a whole the combination in most cases still easily satisfies requirements of specifications.

For example, if the necessary current to pull up the wordline to voltage VPP is 1 mA, and the driving efficiency ($I_{vpp}/I_{vext}$) is 30%, then the consumed current of prior art is $I_{vext}$=1 mA/0.3=3.33 mA. Assuming that one half of the current is provided by the voltage VEXT and the other is provided by the voltage VPP, the consumed current of this embodiment $I_{vext}$=0.5 mA+(0.5 mA/0.3)=2.17 mA. Apparently, the efficiency of the present invention is higher than that of prior art.

In addition, the wordline driver in accordance with one embodiment of the present invention only needs four transistors, which is easily implemented. Even in physical hardware design, only a little overhead entails. There are many choices in switching between transistors 34 and 35, such as choosing a conducting time needed for the transistor 34 equal to that for transistors 35, or switching if the input voltage of the inverter 36 is about one half of the voltage VPP.

The above-described embodiments of the present invention are intended to be illustrative only. Numerous alternative embodiments may be devised by persons skilled in the art without departing from the scope of the following claims.

What is claimed is:

1. A wordline driver applied in a dynamic random access memory (DRAM), comprising:
    a first transistor comprising a first terminal for receiving a first voltage and a second terminal for outputting the first voltage, wherein the first transistor selectively provides the first voltage to a wordline;
    a second transistor comprising a third terminal for receiving a second voltage and a fourth terminal for outputting the second voltage, wherein the fourth terminal is electrically connected to the second terminal of the first transistor, the second transistor provides the second voltage to the wordline, and the second voltage is used to enable the wordline; and
    an inverter, one end of the inverter electrically connected to a gate of the first transistor to control the first transistor to selectively provide the first voltage to the wordline, and the other end of the inverter electrically connected to the fourth terminal of the second transistor.

2. A wordline driver applied in a DRAM, the wordline driver comprising:
    a multiplexer, and the multiplexer comprising:
        a first terminal for receiving a first voltage;
        a second terminal for receiving a second voltage;
        a third terminal for selectively outputting the first voltage or the second voltage to
        a wordline, wherein the second voltage is used to enable the wordline; and
    an inverter, the inverter comprising:
        an output terminal electrically connected to a control input of the multiplexer; and
        an input terminal electrically connected to the third terminal of the multiplexer,
    wherein the inverter is used to control the multiplexer to selectively output the first voltage or the second voltage to the wordline.

3. The wordline driver of claim 2, wherein the time needed for the multiplexer to output the first voltage is the same as that to output the second voltage.

4. A wordline driving method applied in a DRAM, comprising the steps of:
    providing a first voltage on a wordline; and
    providing a second voltage on the wordline for enabling the wordline, wherein the first voltage is smaller than the second voltage and greater than ground voltage for charging the wordline.

5. The wordline driving method of claim 4, wherein the time needed for the multiplexer to output the first voltage is the same as that to output the second voltage.

6. The wordline driving method of claim 4, wherein the first voltage is about one half of the second voltage.

7. The wordline driving method of claim 4, wherein the first voltage is supplied by a power source of the DRAM.

8. The wordline driving method of claim 4, wherein the second voltage is supplied by a charge pump.

* * * * *